United States Patent
Jones, Jr.

(10) Patent No.: US 6,667,927 B2
(45) Date of Patent: Dec. 23, 2003

(54) REFRESH INITIATED PRECHARGE TECHNIQUE FOR DYNAMIC RANDOM ACCESS MEMORY ARRAYS USING LOOK-AHEAD REFRESH

(75) Inventor: Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/136,261

(22) Filed: May 1, 2002

(65) Prior Publication Data

US 2003/0151965 A1 Aug. 14, 2003

Related U.S. Application Data

(63) Continuation-in-part of application No. 10/074,375, filed on Feb. 11, 2002.

(51) Int. Cl.[7] .............................. G11C 7/00; G11C 8/00
(52) U.S. Cl. ................. 365/222; 365/203; 365/230.08; 365/233
(58) Field of Search ............................... 365/222, 203, 365/230.03, 233

(56) References Cited

U.S. PATENT DOCUMENTS

| 4,344,157 | A |   | 8/1982 | White, Jr. et al. | |
|---|---|---|---|---|---|
| 4,831,594 | A | * | 5/1989 | Khosrovi et al. | 365/222 |
| 5,193,072 | A | * | 3/1993 | Frenkil et al. | 365/222 |
| 5,321,661 | A |   | 6/1994 | Iwakiri et al. | |
| 5,856,948 | A | * | 1/1999 | Huang et al. | 365/201 |
| 5,999,472 | A | * | 12/1999 | Sakurai | 365/222 |
| 6,134,167 | A |   | 10/2000 | Atkinson | |
| 6,167,484 | A |   | 12/2000 | Boyer et al. | |
| 6,310,814 | B1 | * | 10/2001 | Hampel et al. | 365/222 |
| 6,404,689 | B1 |   | 6/2002 | Kirihata et al. | |
| 6,411,157 | B1 |   | 6/2002 | Hsu et al. | |
| 2002/0080677 | A1 | * | 6/2002 | Watanabe et al. | 365/233 |
| 2003/0081483 | A1 | * | 5/2003 | De Paor et al. | 365/222 |
| 2003/0128614 | A1 | * | 7/2003 | Hidaka | 365/222 |

* cited by examiner

*Primary Examiner*—David Nelms
*Assistant Examiner*—Ly Duy Pham
(74) *Attorney, Agent, or Firm*—William J. Kubida; Hogan & Hartson LLP

(57) ABSTRACT

A refresh initiated precharge technique using look-ahead refresh eliminates the need to close banks in a dynamic random access memory ("DRAM") array prior to executing a "refresh" command by taking advantage of the fact that the actual initiation of an internal "refresh" operation is delayed by at least one clock cycle from the execution of the external "refresh" command. The technique is effectuated through the issuance of a "refresh" command to cause all banks within the DRAM array to precharge. This precharge occurs prior to the n-cycle delay (where N=1 or more clock cycles) of the internal "refresh" operation. Consequently, it is then unnecessary to execute specific "precharge" commands to close all open banks prior to executing the "refresh" command which frees otherwise consumed instruction bus bandwidth and guarantees that all banks have been precharged (are idle; a required condition) prior to the initiation of on-chip refresh operations. In this manner, the requirement for precharging all banks is automatically satisfied and the associated controller design may be concomitantly simplified.

6 Claims, 3 Drawing Sheets

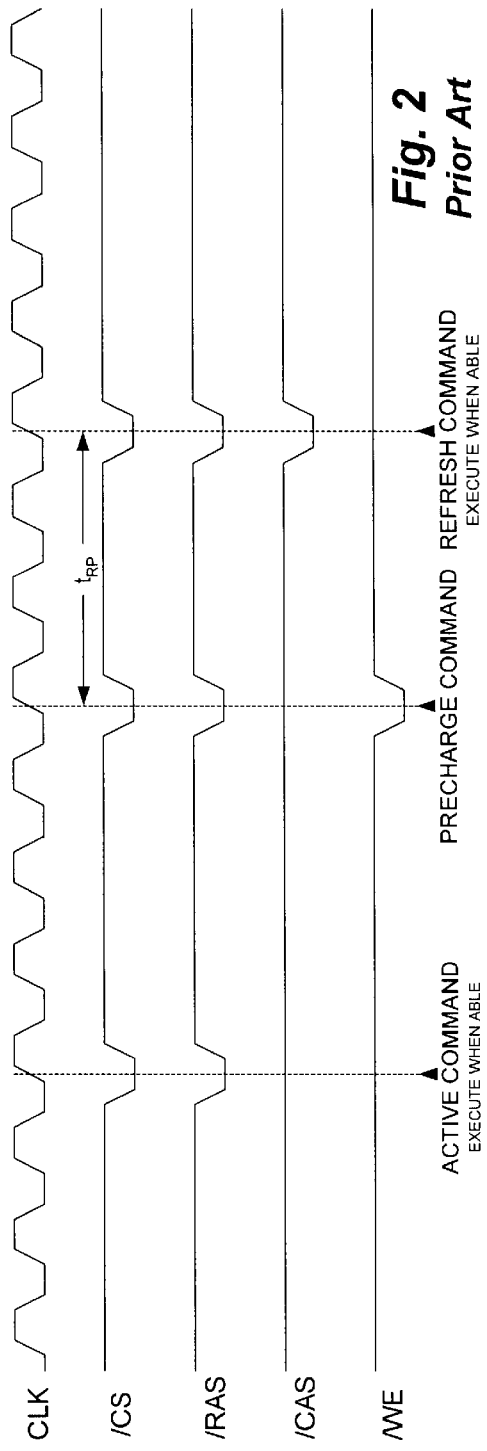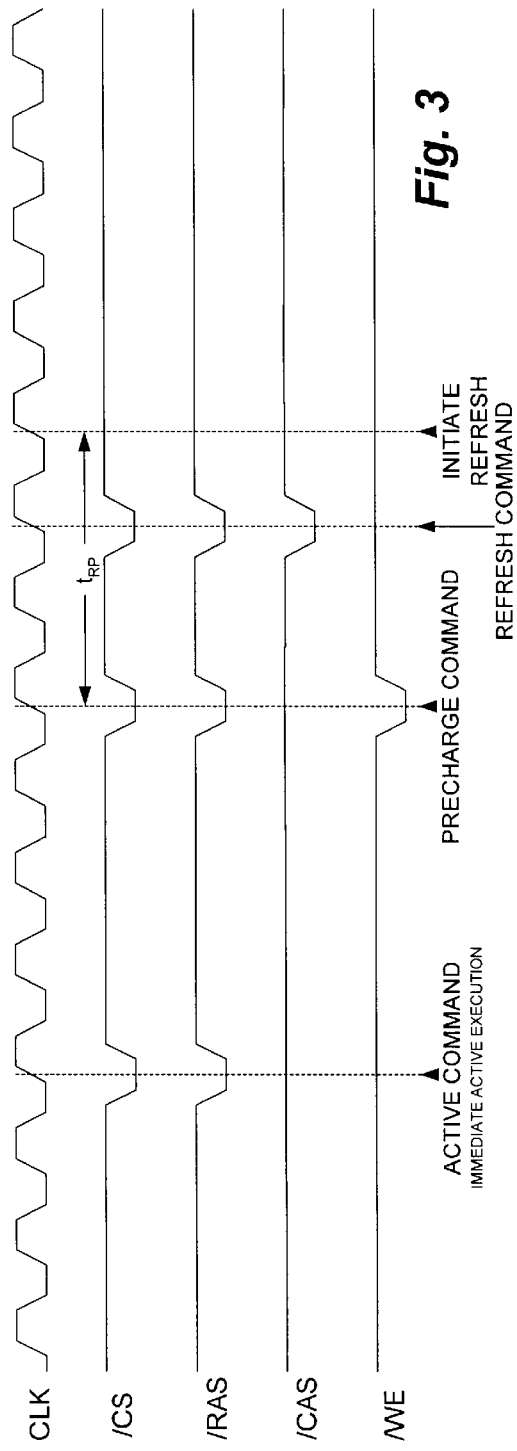

REFRESH INITIATED PRECHARGE TECHNIQUE FOR DYNAMIC RANDOM ACCESS MEMORY ARRAYS USING LOOK-AHEAD REFRESH

CROSS REFERENCE TO RELATED PATENT APPLICATIONS

The present invention is a continuation-in-part of U.S. patent application Ser. No. 10/074,375 filed Feb. 11, 2002 for: "Look-Ahead Refresh For an Integrated Circuit Memory" assigned to United Memories, Inc., Colorado Springs, Colo. and Sony Corporation, Tokyo, Japan, assignees of the present invention, the disclosure of which is herein specifically incorporated by this reference.

BACKGROUND OF THE INVENTION

The present invention relates, in general, to the field of integrated circuit memory devices and those devices incorporating embedded memory arrays. More particularly, the present invention relates to a refresh initiated precharge technique using look-ahead refresh of especial utility with respect to dynamic random access memory ("DRAM"), synchronous DRAM ("SDRAM"), specialty DRAM and embedded DRAM and SDRAM integrated circuit ("IC") devices.

It has long been a goal of memory design to increase the performance of DRAM in order to support higher speed processors. One method of increasing DRAM performance is to increase the "read" and "write" data rate across the memory bus. SDRAM access times and burst data rates are constantly improving by manufacturing process "shrinks" and improved interconnect technology. Additionally, improved command bus utilization has been achieved by reducing the number of instructions needed to perform certain memory operations. In general, the fewer command cycles which are required for the execution of memory commands results in more bus cycles which are then available for memory data transfers.

To date, several approaches have been used to minimize the number of command cycles needed to access SDRAM devices and embedded arrays. One example is the use of "burst accesses" which utilize a single "read" or "write" command execution in order to read or write to multiple sequential words. Another technique for reducing the number of command cycles required to access SDRAMs is the use of an "auto-precharge" mode of operation. Auto-precharge is a programmable mode wherein a "precharge" operation automatically occurs at the end of a predetermined number of burst "read" or "write" cycles without requiring the assertion of an external "precharge" command. Similarly, the execution of a "refresh" command in SDRAMs results in the device automatically precharging at the end of the "refresh" operation.

A "refresh" or "active" command can occur on any clock cycle in an integrated circuit memory, requiring internal (on-chip) detection of the cycle type being executed. This detection process slows down the row address path within the device. On-chip refresh circuitry has been incorporated in DRAM designs for several decades. When first introduced, a separate refresh pin was used to inform the DRAM to execute a refresh operation using internally generated addresses instead of a normal, externally supplied row address. Later, /CAS-before-/RAS (CAS=column address strobe, and RAS=row address strobe) commands were used to enable on-chip refresh cycles. When /CAS was "high" and /RAS went "low", a normal row selection was done using the external address supplied to the time when /RAS went "low". However, if /CAS was "low" when /RAS went "low", then a refresh operation was executed using an internally generated refresh address.

Conventional SDRAMs currently support two different types of refresh operations: auto-refresh and self-refresh. Auto-refresh uses a specific command instruction: /CS (chip select), /RAS, and /CAS "low" with /WE (write enable) "high" that is sampled at the rising edge of the DRAM's input clock signal. The self-refresh command is similar to auto-refresh, but occurs concurrently with entering power-down mode. In self-refresh operation, the device periodically executes refresh cycles (which are self-timed) to maintain stored data integrity during power-down mode.

In the past, incorporating on-chip refresh techniques using the methods described above, had little impact on device performance. However, as the operating frequency of DRAMs and SDRAMs has increased, the inclusion of on-chip refresh using conventional methods has had an impact on row access performance. With present methods, during any cycle that an active command can be executed, a refresh command could have been executed instead, provided the device had been previously idle (in precharge state.) For this reason, the on-chip circuitry must hold-off row selection while the appropriate address is selected, depending on whether the present instruction is an "active" or a "refresh" command. This process is complicated in most instances and a command address latch is used to hold either the externally supplied row address or the internally generated address from the refresh address counter depending on the command. As clock rate increases, the operational time penalty due to selecting which address to use before row selection can be enabled will become a larger percentage of the row select time.

Further, with conventional DRAM-based memory technology, open memory banks must be closed prior to the issuance of a "refresh" command. These banks are required to be closed by issuing individual "precharge" commands to open banks using a "precharge all" to close open banks or "auto-precharge" commands for "read" or "write" cycles to ensure that an opened bank has been closed (or precharged) prior to issuing a refresh command.

SUMMARY OF THE INVENTION

A refresh initiated precharge technique using look-ahead refresh eliminates the need to close banks in a dynamic random access memory ("DRAM") array prior A to executing a "refresh" command by taking advantage of the fact that the actual initiation of an internal "refresh" operation is delayed by at least one clock cycle from the execution of the external "refresh" command. The technique is effectuated through the issuance of a "refresh" command to cause all banks within the DRAM array to precharge. This precharge occurs prior to the n-cycle delay (where N=1 or more clock cycles) of the internal "refresh" operation.

Consequently, it is then unnecessary to execute specific "precharge" commands to close all open banks prior to executing the "refresh" command which frees otherwise consumed instruction bus bandwidth and guarantees that all banks have been precharged (are idle; a required condition) prior to the initiation of on-chip refresh operations. In this manner, the requirement for precharging all banks is automatically satisfied and the associated controller design may be concomitantly simplified.

Particularly disclosed herein is a method and means for initiating precharge operations to at least one bank of a dynamic random access memory array. The method comprises: supplying a refresh command to the memory array; substantially concurrently precharging the memory array bank in response to the refresh command; and initiating refresh operations to the memory bank at least one clock cycle following the step of supplying the refresh command.

Also disclosed herein is an integrated circuit device including a dynamic random access memory array which comprises: a refresh command input for receiving a refresh command signal thereon; and control logic coupled to receive the refresh command signal for initiating a refresh operation on at least a portion of the memory array in response thereto. The control logic is further operational for initiating a precharge operation to at least one bank of the memory array substantially concurrently with receipt of the refresh command signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 2 is a simplified timing diagram associated with the operation of the row address buffer circuits of prior art DRAM-based memory devices;

FIG. 3 is a simplified timing diagram associated with the operation of the row address buffer circuit using a look-ahead refresh technique as disclosed and claimed in the aforementioned patent application.

DESCRIPTION OF A REPRESENTATIVE EMBODIMENT

Figure 1:
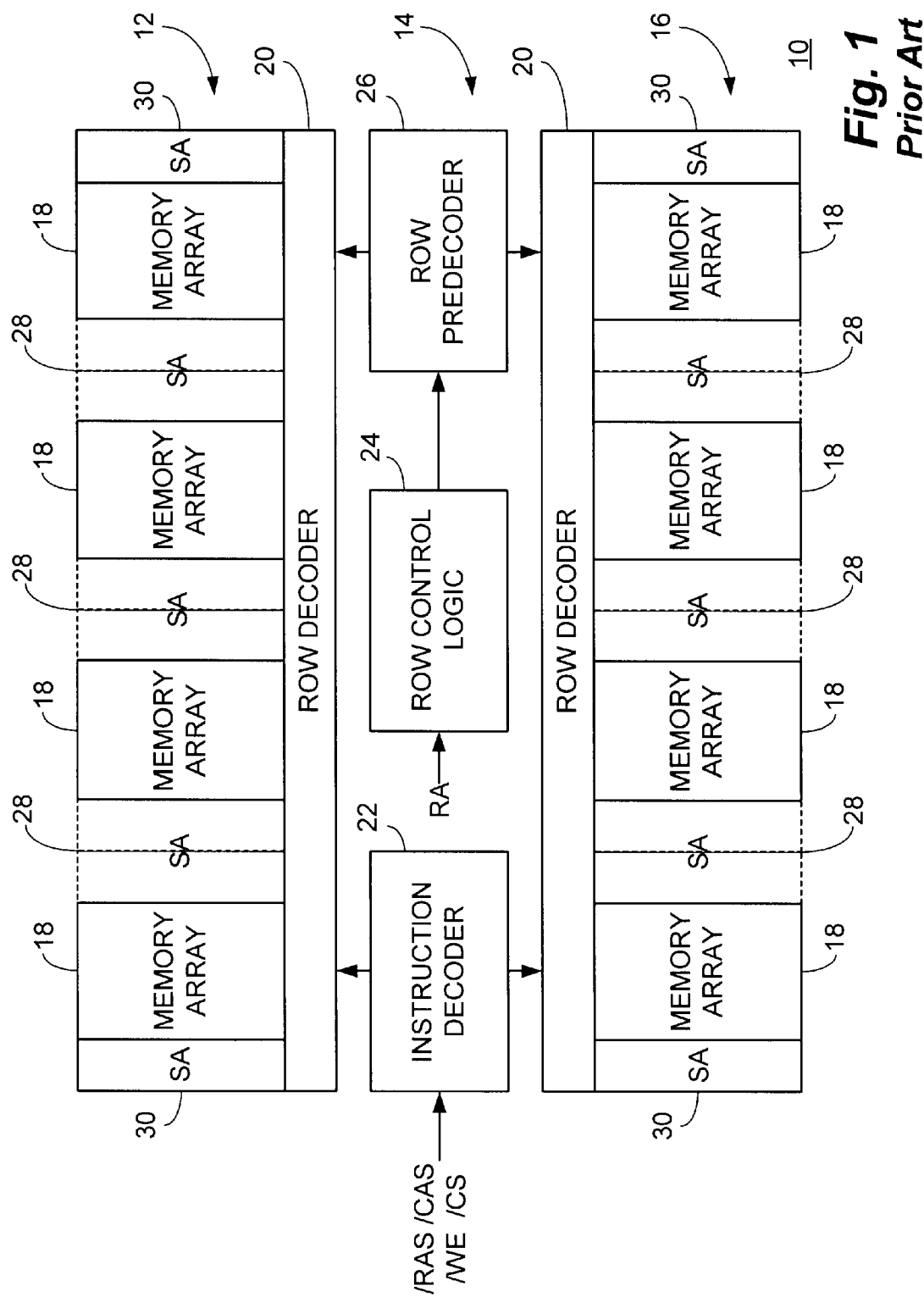
FIG. 1 is a high-level functional block diagram of a typical integrated circuit memory including two memory array portions with associated row control circuitry including an instruction decoder, a row control logic block and a row predecoder.

With reference now to FIG. 1, a high level functional block diagram of a typical integrated circuit memory 10, such as a DRAM chip or an integrated circuit device incorporating embedded memory, includes two matching memory array portions 12 and 16 with associated row control circuitry 14 If including an instruction decoder 22 with /RAS, /CAS, /WE, and /CS inputs, a row control logic block 24 including an RA (row address) input which is, in turn, coupled to a row predecoder 26. The outputs of the instruction decoder 22 and row predecoder 26 are coupled to array portions 12 and 16. The row predecoder 26 "predecodes" the externally applied address, which is, in turn, completely decoded by row decoders 20. Each memory array portion 12 and 16 includes a number of memory arrays 18 (four are shown in this figure, but any number can be provided as desired) and associated shared sense-amplifier blocks 28 and end sense-amplifier blocks 30. It should be noted that the memory 10 is only shown as a simplified typical example of an integrated circuit memory and therefore many typical functional blocks are not shown. Additionally, the architecture and layout of the memory can be changed if desired and still use the row address buffer circuit of the present invention, which is described in further detail below.

With reference additionally now to FIG. 2, a simplified timing diagram associated with the "active" and "refresh" operation of the row address buffer circuits of the memory 10 of the preceding figure is shown. The enabling of the row selection circuitry must be delayed until the source (external address) can be determined. (It should be noted that the "read" and "write" commands have been omitted in order to simplify the diagram. The "precharge" command precharges the selected row and bank in the memory array. Similarly, enabling of the row selection circuitry must be again delayed until the source (the internal address from the refresh counter) can be determined.

With reference additionally now to FIG. 3, a simplified timing diagram associated with the "active" and "refresh" operation of a row address buffer circuit in accordance with the disclosure of the aforementioned U.S. patent application Ser. No. 10/074,375 is shown. In this regard, the row active command does not have to wait to determine the source of the row address. As before, the "read" and "write" commands have been omitted to simplify the timing diagram, and the "precharge" command precharges the selected row and bank in the memory array. The refresh command is delayed by one clock cycle. The refresh cycle can, therefore, start immediately after the clock because there is no need to wait to determine the source of the address, whether internal or external.

Figure 4:
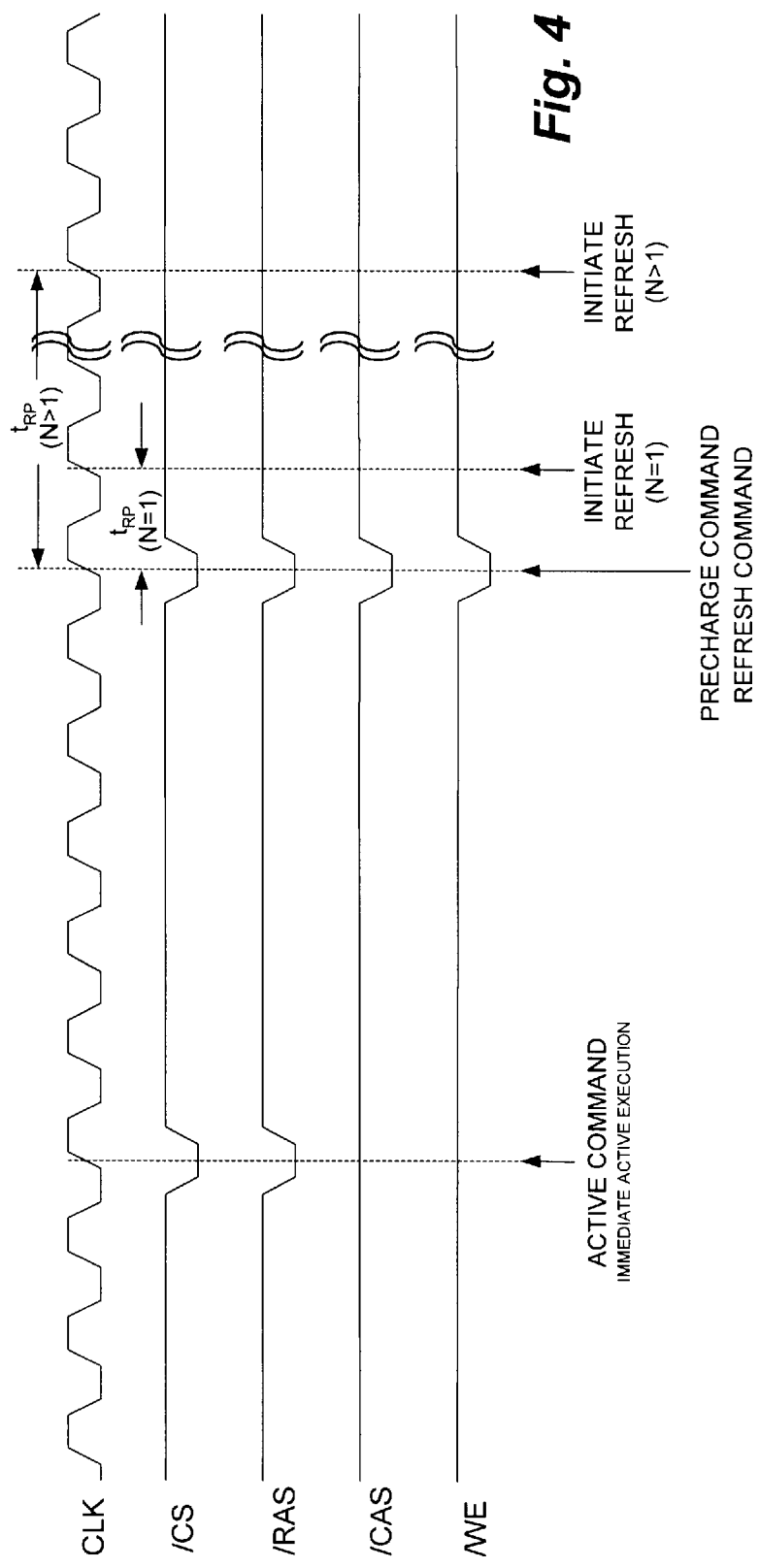
FIG. 4 is a simplified timing diagram of a refresh initiated precharge technique for dynamic random access memory arrays using look-ahead refresh in accordance with the disclosure of the present invention.

With reference additionally now to FIG. 4, a simplified timing diagram of a refresh initiated precharge technique for dynamic random access memory arrays using look-ahead refresh in accordance with the disclosure of the present invention is shown. As illustrated, all banks of the memory array may be precharged substantially concurrently with the execution of the external "refresh" command. Initiation of the refresh operation will occur one clock cycle later where N=1 (with a resultant $t_{RP}$ of one clock cycle) or some other number of clock cycles later when N>1 (with a comparable $t_{RP}$ time).

With respect to the technique illustrated in the preceding FIG. 3, it was contemplated that all "active" banks were to have been precharged (in idle mode) prior to the internal execution of a "refresh". Since the internal "refresh" operation does not start until one clock cycle after the external "refresh" command is executed, the look-ahead refresh definition therein disclosed allows a "precharge" command to be executed simultaneously with the external "refresh" command as shown in FIG. 4. If multiple banks are open, all banks, except for the one bank precharged simultaneously with the "refresh" command must have been precharged during previous clock cycles (assuming a "precharge all" command is not available).

In accordance with the technique of the present invention, the look-ahead refresh functionality illustrated in the preceding figure is enhanced by precharging all active banks when the "refresh" command is externally executed, without the need of executing "precharge" commands to individual active banks or the need to execute a "precharge all" command, if available. It should be noted that simultaneously precharging and initiating a refresh command is possible only when the command structure allows it. Through the use of the present invention, standard SDRAMs can eliminate the need for executing "precharge" commands prior to entering "refresh".

While there have been described above the principles of the present invention in conjunction with specific applications of the technique disclosed herein, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for initiating precharge operations to at least one bank of a dynamic random access memory array comprising:

supplying a refresh command to said memory array;

substantially concurrently precharging said at least one bank of said memory array in response to said refresh command; and initiating refresh operations to said at least one bank of said memory array at least one clock cycle following said step of supplying said refresh command.

2. The method of claim 1 wherein said step of supplying said refresh command comprises the step of:

firstly asserting a column address signal to said dynamic random access memory array; and secondly asserting a row address signal to said dynamic random access memory array.

3. The method of claim 2 further comprising:

substantially concurrently asserting a chip select signal to said dynamic random access memory array.

4. An integrated circuit device including a dynamic random access memory array incorporated therewith, said integrated circuit device comprising:

means for supplying a refresh command to said memory array;

means for substantially concurrently precharging said at least one bank of said memory array in response to said refresh command; and means for initiating refresh operations to said at least one bank of said memory array at least one clock cycle following said step of supplying said refresh command.

5. The integrated circuit device of claim 4 wherein said means for supplying said refresh command to said memory array comprises:

means for firstly asserting a column address signal to said dynamic random access memory array; and means for secondly asserting a row address signal to said dynamic random access memory array.

6. The integrated circuit device of claim 5 wherein said means for supplying said refresh command to said memory array comprises:

means for substantially concurrently asserting a chip select signal to said dynamic random access memory array.

* * * * *